(12) United States Patent
Cao et al.

(10) Patent No.: US 10,373,537 B2
(45) Date of Patent: Aug. 6, 2019

(54) METHOD FOR DETECTING ARRAY SUBSTRATE OF DISPLAY PANEL

(71) Applicant: BOE TECHNOLOGY GROUP CO., LTD., Beijing (CN)

(72) Inventors: Kun Cao, Beijing (CN); Zhongyuan Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/122,579

(22) PCT Filed: Oct. 20, 2015

(86) PCT No.: PCT/CN2015/092291
§ 371 (c)(1),
(2) Date: Aug. 30, 2016

(87) PCT Pub. No.: WO2016/179965
PCT Pub. Date: Nov. 17, 2016

(65) Prior Publication Data
US 2017/0154556 A1 Jun. 1, 2017

(30) Foreign Application Priority Data

May 14, 2015 (CN) .......................... 2015 1 0245186

(51) Int. Cl.
*G09G 3/00* (2006.01)
*G09G 3/32* (2016.01)
(Continued)

(52) U.S. Cl.
CPC ............. *G09G 3/006* (2013.01); *G09G 3/325* (2013.01); *G09G 3/3233* (2013.01);
(Continued)

(58) Field of Classification Search
CPC ...... G09G 3/006; G09G 3/325; G09G 3/3266; G09G 2300/043; G09G 2300/0809;
(Continued)

(56) References Cited

U.S. PATENT DOCUMENTS

2001/0040565 A1 11/2001 Koyama
2002/0044124 A1* 4/2002 Yamazaki .............. G09G 3/006
345/92

(Continued)

FOREIGN PATENT DOCUMENTS

CN 1721865 A 1/2006
CN 1726526 A 1/2006
(Continued)

OTHER PUBLICATIONS

Office Action in Chinese Application No. 201510245186.1 dated Jun. 6, 2017, with English translation.
(Continued)

*Primary Examiner* — Stephen G Sherman
(74) *Attorney, Agent, or Firm* — Womble Bond Dickinson (US) LLP (57) ABSTRACT

A method for detecting a display panel is disclosed. The display panel comprises an array substrate for driving an electroluminescent device. The array substrate comprises pixel electrodes arranged in an array and an array of pixel switches for driving the pixel electrodes. The method comprises the steps of: S1, applying a first driving signal to a manufactured array substrate, monitoring a first voltage on the pixel electrode; S2, forming a second electrode on each of the pixel electrodes of the array substrate; S3, applying a second driving signal to the array substrate formed with the second electrode, monitoring a second current flowing through the second electrode. The pixel electrode is one of the cathode and the anode of the electroluminescent device, (Continued)

the second electrode is the other one of the cathode and the anode of the electroluminescent device.

18 Claims, 4 Drawing Sheets

(51) Int. Cl.
   *H01L 21/66* (2006.01)
   *G09G 3/325* (2016.01)
   *G09G 3/3266* (2016.01)
   *G09G 3/3291* (2016.01)
   *G09G 3/3233* (2016.01)

(52) U.S. Cl.
   CPC ......... *G09G 3/3266* (2013.01); *G09G 3/3291* (2013.01); *H01L 22/14* (2013.01); *G09G 2300/043* (2013.01); *G09G 2300/0809* (2013.01)

(58) Field of Classification Search
   CPC ..... G09G 3/30–3291; G09G 2320/029; G09G 2320/0295; H01L 22/14
   USPC .................................... 345/76–83; 315/169.3
   See application file for complete search history.

(56) References Cited

U.S. PATENT DOCUMENTS

| | | |
|---|---|---|
| 2006/0028231 A1 | 2/2006 | Kishida et al. |
| 2006/0255244 A1 | 11/2006 | Choi |
| 2008/0180126 A1* | 7/2008 | Okayasu ........... H01L 21/76254 324/750.15 |
| 2008/0266214 A1* | 10/2008 | Naugler ............... G09G 3/3225 345/76 |
| 2012/0306939 A1 | 12/2012 | Choi et al. |

FOREIGN PATENT DOCUMENTS

| | | |
|---|---|---|
| CN | 1374714 A | 5/2006 |
| CN | 1942029 A | 4/2007 |
| CN | 101038315 A | 9/2007 |
| CN | 101359613 A | 2/2009 |
| CN | 104090437 A | 10/2014 |
| CN | 104809970 A | 7/2015 |
| JP | 2004191603 A | 7/2004 |
| TW | 538246 B | 6/2003 |
| WO | WO 2005/096256 A1 | 10/2005 |

OTHER PUBLICATIONS

Office Action in Chinese Application No. 201510245186.1 dated Feb. 6, 2017, with English translation. 9 pages.

International Search Report and Written Opinion in PCT/CN2015/092291 dated Feb. 15, 2016, with English translation. 16 pages.

* cited by examiner

METHOD FOR DETECTING ARRAY SUBSTRATE OF DISPLAY PANEL

RELATED APPLICATIONS

The present application is the U.S. national phase entry of PCT/CN2015/092291, with an international filling date of Oct. 20, 2015, which claims the benefit of Chinese Patent Application NO. 201510245186.1, filed on May 14, 2015, the entire disclosure of which is incorporated herein by reference.

FIELD OF THE INVENTION

The present invention relates to the field of display technology, and particularly to a method for detecting a display panel.

BACKGROUND

The manufacture of a display panel of the display device generally comprises a plurality of procedures. For example, the manufacture of an AMOLED (Active Matrix Organic Light Emitting Diode) display panel generally comprises a procedure of manufacturing an array substrate (backboard), a procedure of manufacturing an organic light-emitting layer (EL), a procedure of encapsulation, and so on. In the procedure of manufacturing an array substrate, deficiency screening is usually performed for a manufactured array substrate using array test process to determine whether it has deficiencies. On the one hand, defective array substrates can be prevented from forwarding into subsequent procedures to produce defective display panels. On the other hand, the stability of the process of manufacturing an array substrate may be monitored.

In order to verify the reliability of the array test process, it is usually required to put part of array substrates into the procedure of manufacturing an organic light-emitting layer and the procedure of encapsulation to obtain display panel cells. Then, the display panel cells are tested using display panel cell test process, i.e. performing test by lighting up the panel cells to thereby verify the reliability of the array test so as to correct the test conditions for the array test process.

However, the manufacture of the organic light-emitting layer requires a high cost, which consequently leads to a high cost of the entire display panel detection process. Meanwhile, during the procedure of manufacturing an organic light-emitting layer, certain deficiencies may also occur. It is hard to distinguish these deficiencies from those produced in the procedure of manufacturing an array substrate, which causes the entire detection process of the display panel to be complicated and is disadvantageous to improvement of the reliability of the array test.

SUMMARY

The embodiment of the invention provides a method for detecting a display panel to mitigate or alleviate the above problem.

In accordance with an embodiment of the invention, the display panel may comprise an array substrate for driving an electroluminescent device, and the array substrate may comprise pixel electrodes arranged in an array and an array of pixel switches for driving the pixel electrodes. The method for detecting a display panel may comprise steps of:

S1, applying a first driving signal to a manufactured array substrate, monitoring a first voltage of the pixel electrode;

S2, forming a second electrode on each of the pixel electrodes of the array substrate, and S3, applying a second driving signal to the array substrate formed with the second electrode, monitoring a second current flowing through the second electrode.

The pixel electrode is one of the cathode and the anode of the electroluminescent device, the second electrode is the other one of the cathode and the anode of the electroluminescent device.

For the detection method provided by this embodiment, since it is not required to manufacture an organic light-emitting layer, the cost of the entire detection process may be significantly reduced. Meanwhile, the interference resulting from new deficiencies that may be introduced by the manufacture of the organic light-emitting layer is also excluded, the display panel detection process is simplified, and the complexity of detection is decreased, which facilities improvement of the display panel detection efficiency.

In an embodiment of the invention, the manufacture of the array substrate may comprise testing the array substrate to determine a deficiency in the array substrate. Such test may also be called an array test in the art. The method may further comprise verifying a test result of the testing by means of the first voltage and the second current. In the embodiment, the first voltages and the second currents which have been monitored may be utilized effectively, for example, they may be compared, etc. In this way, the test result of the preceding array test can be effectively verified or validated so as to improve the reliability of the array test.

In accordance with another embodiment of the invention, the method for detecting a display panel may further comprise plotting a first voltage contour, the first voltage contour indicating the pixel electrodes in the array substrate which have equal first voltages; and plotting a second current contour, the second current contour indicating the second electrodes in the array substrate which have equal second currents.

Further, the step of verifying a test result of the testing by means of the first voltage and the second current according to the embodiment of the invention may comprise comparing the first voltage contour with the second current contour. In this way, comparing the plotted contours provides a convenient, efficient manner to verify or validate the array test result, enhances the convenience and further improves the display panel detection efficiency.

Alternatively, in accordance with another embodiment of the present invention, the method may further comprise obtaining a first threshold voltage of the pixel switch by means of the first voltage, and obtaining a second threshold voltage of the pixel switch by means of the second current.

Further, the method may further comprise comparing the first threshold voltage with the second threshold voltage. By comparing the first threshold voltage with the second threshold voltage, the array test result can also be verified or validated to improve the reliability of the array test.

In accordance with a further embodiment of the invention, the method further comprises encapsulating the array substrate after forming the second electrodes.

Further, the step of testing the array substrate to determine a deficiency in the array substrate may comprise leading out scanning lines for the array of pixel switches using a short-circuit ring to the periphery of the array substrate.

Further, the method may comprise removing the short-circuit ring prior to the start of the step S3.

In the method provided by the embodiment of the invention, the electroluminescent device may be an organic light-emitting diode, and the array substrate may be an AMOLED array substrate.

BRIEF DESCRIPTION OF THE DRAWINGS

Implementations of the detection method according to embodiments of the present invention are described below by way of example with reference to the drawings. The drawings are schematic and not plotted to scale, which are only for the purpose of illustrating embodiments of the invention and do not intend to limit the protection scope of the present invention.

DETAILED DESCRIPTION

Embodiments described herein are mainly directed at a method for detecting a display panel. The display panel may comprise an array substrate for driving an electroluminescent device. The array substrate may comprise pixel electrodes arranged in an array and an array of pixel switches for driving the pixel electrodes. The electroluminescent device may be various luminescent devices suitable for acting as a pixel unit of the display panel, which include but are not limited to various LED devices, e.g. organic light-emitting diode (OLED), etc. In the event that the electroluminescent device is an OLED, the array substrate may be an AMOLED array substrate.

To set forth the principle and concept of the disclosure in a clear and convenient manner, in the embodiments below, the method for detecting a display panel as proposed by the disclosure will be set forth by taking the example that the array substrate is an AMOLED array substrate. Certainly, the method proposed by the disclosure may also be applied to a display panel comprising other types of electroluminescent device.

In embodiments of the present invention, the display panel may comprise an array substrate for driving an electroluminescent device OLED. The array substrate may comprise pixel electrodes arranged in an array and an array of pixel switches for driving the pixel electrodes. The pixel electrodes may be formed during the process of manufacturing the array substrate or formed additionally after the array substrate has been basically prepared.

Figure 1:
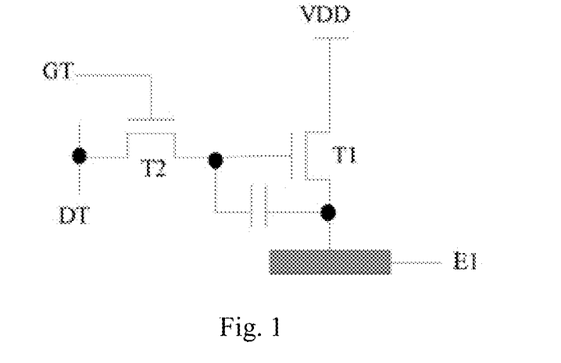
FIG. 1 illustrates a single pixel electrode of the AMOLED array substrate and a driving circuit thereof.
Figure 2:
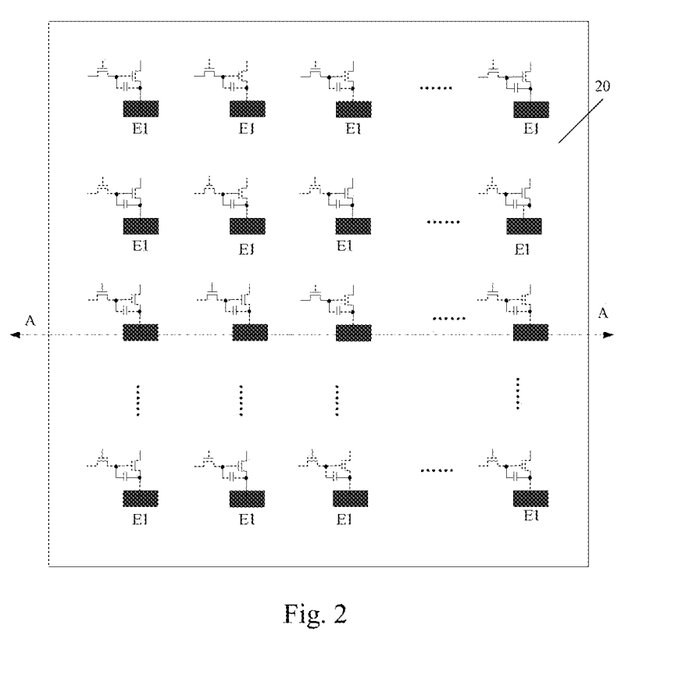
FIG. 2 illustrates the pixel units of the array substrate in the display panel according to an embodiment of the invention.

FIG. 1 illustrates a single pixel electrode in the AMOLED array substrate and a driving circuit thereof. In the example of FIG. 1, the driving circuit is exemplified by a dual-switch driving circuit comprising a first thin film transistor (TFT) T1 and a second thin film transistor T2, in which T1 is electrically connected to a single pixel electrode E1 and acts as a pixel switch for driving the pixel electrode E1. Certainly, the driving circuit of the pixel electrode E1 may also be pixel driving circuits of other forms comprising three, four or more TFTs which are known to those skilled in the art. FIG. 2 illustrates the pixel units of the array substrate in the display panel according to an embodiment of the invention. The array substrate 20 comprises pixel electrodes E1 arranged in an array and pixel switches connected to the pixel electrodes E1.

Figure 3:
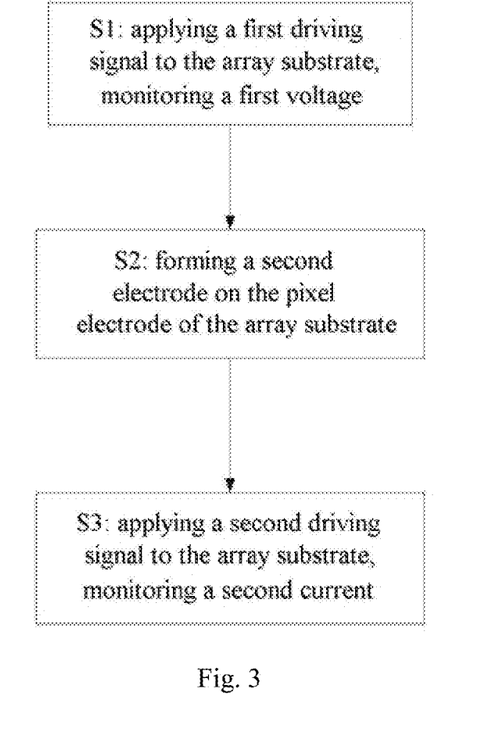
FIG. 3 is a flow chart of the method for detecting a display panel according to an embodiment of the present invention.

FIG. 3 shows a flow chart of the method for detecting a display panel according to an embodiment of the invention. As shown in FIG. 3, the method may comprise the following steps.

S1, applying a first driving signal to the manufactured array substrate, and monitoring a first voltage of a pixel electrode;

S2, forming a second electrode on each of the pixel electrodes of the array substrate;

S3, applying a second driving signal to the array substrate formed with the second electrode, monitoring a second current flowing through the second electrode. The pixel electrode is one of the cathode and the anode of the electroluminescent device, the second electrode is the other one of the cathode and the anode of the electroluminescent device.

Figure 4:
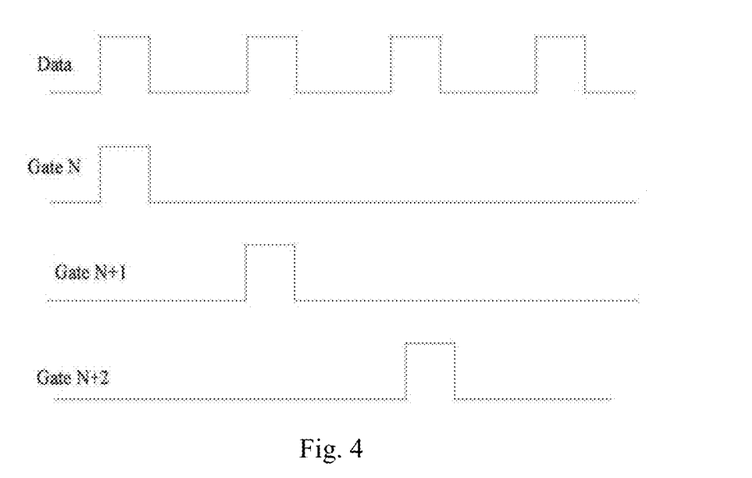
FIG. 4 is a schematic view of the waveform of a driving signal for driving the AMOLED array substrate according to an embodiment of the present invention.

In this embodiment, in step S1, the driving signal may be applied to the manufactured array substrate using a conventional signal source, and then the first voltages of the pixel electrodes may be monitored. For example, as for an AMOLED array substrate comprising the pixel unit as shown in FIG. 1, the time sequence of a scanning signal GT and a data signal DT outputted by the signal source may be adjusted thereon, and each row of pixel units of the AMOLED array substrate may be powered up successively. In this way, the first voltage of each of the pixel electrodes may be monitored using a voltage detection device (herein, the voltage of the pixel electrode which is monitored at this stage may be referred to as "first voltage"). Certainly, it is also possible to only monitor the first voltages of the pixel electrodes within partial regions of the AMOLED array substrate, or selectively monitor the first voltages of the pixel electrodes within certain local regions of the AMOLED array substrate. FIG. 4 illustrates the waveform of the first driving signal outputted from the signal source and applied to the array substrate, in which Data represents the waveform of a data signal, which may be used as the data signal DT of the single pixel unit as shown in FIG. 1, and Gate N represents a scanning signal for the N-th row of pixel units, which can be used as the scanning signal GT of the single pixel unit as shown in FIG. 1. Certainly, it should be understood that any appropriate driving waveforms used in conventional panel testing processes may be applied in the embodiments of the present invention.

Figure 5:
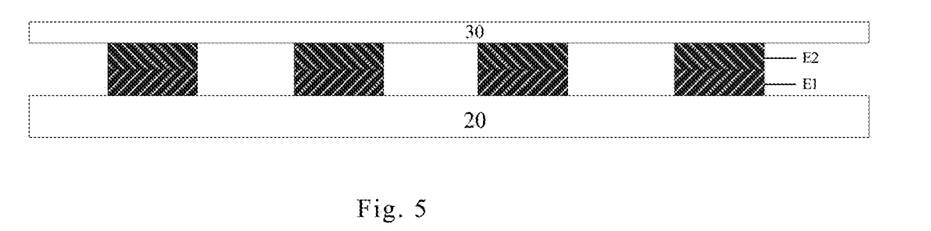
FIG. 5 is a partial sectional view of FIG. 2 taken along the line AA in FIG. 2.

In step S2, the second electrode is formed on each of the pixel electrodes of the array substrate. For example, the second electrode may be evaporation plated on the pixel electrode. In this way, a direct connection may be formed between the second electrode and the pixel electrode. For example, as shown in FIG. 5, the second electrode E2 is formed on the pixel electrode E1 of the array substrate 20. It is to be noted that, the second electrode may be the cathode or anode of the electroluminescent device OLED, which depends on the type of the OLED structure. For example, the second electrode may be the cathode of the OLED, and the pixel electrode E1 may be the anode of the OLED in this case. For another example, in case the OLED has a reverse structure, the pixel electrode E1 may be the cathode of the OLED, and the second electrode may be the anode of the OLED at this time. Therefore, with embodiments of the present invention, the conventional manufacture of an organic light-emitting layer may be omitted, thus the step of lighting up the display panel may also be omitted in the subsequent detection process.

In step S3, the second driving signal is applied to the array substrate on the basis that the second electrodes are formed on the array substrate, and the currents flowing through the second electrodes are monitored (herein, the current flowing through the second electrode which is monitored at this stage is also referred to as "second current"). Likewise, it is also possible to only monitor the second currents of the second electrodes within partial regions of the AMOLED array substrate, or selectively monitor the second currents of the second electrodes within certain local regions of the AMOLED array substrate. Moreover, a voltage or current detection device and method well known to those skilled in the art may be used to carry out the monitoring of the first voltages or the second currents. In embodiments, depending on the type of device in which the array substrate is to be applied, the second driving signal used in step S3 and the first driving signal used in step S1 may have the same or different characteristics. For example, it is possible to use driving signals having the same waveform or driving signals having different waveforms. Certainly, during this process, the display panel would not emit light due to the absence of the organic light-emitting layer.

In the embodiment of the method for detecting a display panel according to the invention, since it is not required to manufacture an organic light-emitting layer, the cost of the entire detection process may be significantly reduced. In addition, the interference resulting from new deficiencies that may be introduced by the manufacture of the organic light-emitting layer is also excluded, the display panel detection process may be simplified greatly, and the complexity of detection process may be decreased.

In another embodiment, manufacturing the array substrate may comprise testing the array substrate to determine deficiencies in the array substrate. Such test is carried out for a manufactured array substrate. Any appropriate array test process known to those skilled in the art may be used to determine whether the manufactured array substrate has deficiencies such as short circuit and broken circuit. Such test or determination of deficiencies is known to those skilled in the art, for example, as disclosed in a patent application publication: CN101359613A.

In this case, the method for detecting a display panel according to the embodiment of the invention may comprise verifying the test result of the testing by means of the first voltages and the second currents. That is, the result of the array test process may be verified by using the second currents and first voltages which have been monitored so as to adjust the conditions for the array test process when necessary, thereby improving the reliability of the array test process. For example, the first voltages and the second currents for two randomly given pixel units of the AMOLED array substrate may be compared respectively to obtain the difference between the first voltages for the two pixel units and the difference between the second currents for the two pixel units. The result of the array test may be verified based on the difference between the first voltages and the difference between the second currents. For example, if there is a great discrepancy between the difference between the first voltages for the above two pixel units and the difference between the second currents for the above two pixel units, this may indicate that there is a need to adjust the conditions for the array test so as to redetect whether the array substrate has defects or deficiencies.

Figure 6:
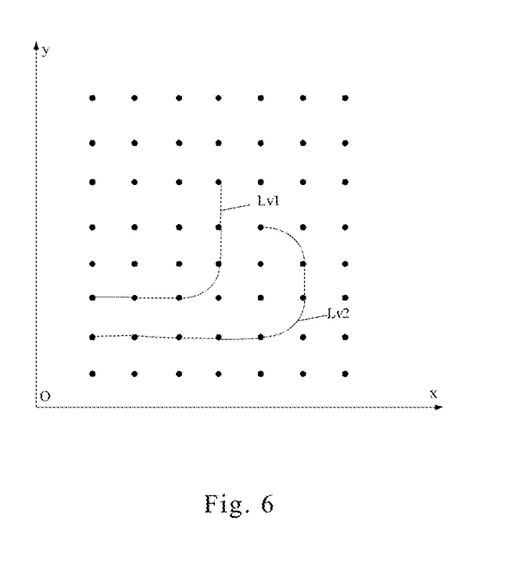
FIGS. 6 and 7 respectively illustrate the first voltage contour and the second current contour according to an embodiment of the invention.
Figure 7:
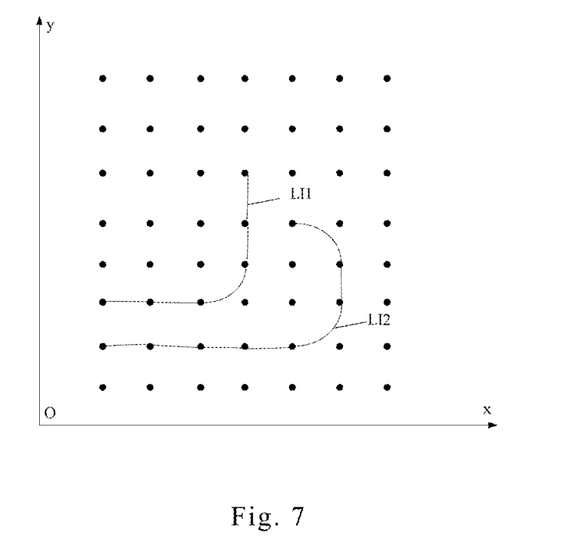

In another embodiment of the method according to the invention, it may further comprise the step of plotting a first voltage contour and plotting a second current contour. The first voltage contour indicates pixel electrodes in the array substrate which have equal first voltages, and the second current contour indicates second electrodes in the array substrate which have equal second currents. For example, the first voltage contour may be plotted during the process of the above step S1, and the second current contour may be plotted during the process of the above step S3. For example, a map that can illustrate the positions of respective pixel units of the AMOLED array substrate may be drawn in a coordinate system. Accordingly, after monitoring the first voltages, the positions of the pixel electrodes in the AMOLED array substrate which have equal first voltages can be obtained, and these positions may be connected to form the first voltage contour. FIG. 6 illustrates an example of the first voltage contour. In FIG. 6, an xy-coordinate system is established based on the array substrate, the black dots in FIG. 6 represent the positions for the pixel electrodes on the array substrate in the coordinate system. In this example, by connecting the dots denoting the positions of the pixel electrodes having equal first voltages, two first voltage contours Lv1 and Lv2 are obtained. Likewise, after monitoring the second currents, the positions of the second electrodes in the AMOLED array substrate which have equal second currents may be obtained, and these positions may be connected to form the second current contour. For example, FIG. 7 illustrates two second current contour LI1, LI2.

It can be understood that since in step S1 the monitored first voltages on different pixel electrodes may be different, and in step S3 the monitored currents flowing through different second electrodes may be different, there may be multiple first voltage contours and multiple second current contours. After the first voltages and the second currents have been monitored, the first voltage contour and the second voltage contour may be plotted on a computer platform by virtue of software.

In the embodiments, the test result of the array test may be verified in an efficient manner by comparing the first voltage contour and the second current contour, thereby improving the reliability of the array test process. For example, if the first voltage contour is identical with or slightly different from the second current contour, it may indicate a good or acceptable array test result; otherwise, it may be required to adjust the test conditions for the array test to perform the array test over again or improve the technical process of the array test.

The method for detecting a display panel according to an embodiment of the invention may further comprise obtaining a first threshold voltage of the pixel switch by means of the first voltage and obtaining a second threshold voltage of the pixel switch by means of the second current. For example, on the basis of obtaining the first voltages and the second currents, the first threshold voltage or the second threshold voltage may be obtained by means of conventional measurement or calculation method in the art. For example, in step S1 the first threshold voltage may be measured using a dedicated threshold voltage parameter measurement device commonly used in the art; in step S3, the second threshold voltage may be calculated using a calculation theory (e.g. Chih-Tang Sah equation) well known to those skilled in the art based on the obtained second current.

Certainly, it can be understood that a plurality of first threshold voltages and a plurality of second threshold voltages may be obtained due to the presence of multiple pixel units.

Alternatively, in another embodiment, the test result of the array test may be verified or validated by comparing the first threshold voltage and the second threshold voltage, thereby improving the reliability of the array test process. For example, if the first threshold voltage and the second threshold voltage are identical or slightly different, it can indicate a good or acceptable array test result; otherwise, it may be required to adjust the test conditions for the array test to improve the technical process of the array test.

In addition, the first threshold voltage and the second threshold voltage may be utilized effectively to improve the quality or performance of the display panel. For example, the threshold voltages of the pixel switches of different pixel units for driving the pixel electrodes can be compared to obtain the uniformity of threshold voltages. This is beneficial to improvement of the quality or performance of the display panel. For example, if the uniformity of threshold voltages is not within a reasonable range, the threshold voltages of some pixel switches may be compensated accordingly using compensation techniques known to those skilled in the art so as to obtain reasonable uniformity of threshold voltages and finally improve homogeneity of the brightness of the display panel.

In a further embodiment of the invention, the array substrate may be encapsulated after the second electrodes are formed. For example, the array substrate may be encapsulated using a cover plate, which facilitates the subsequent operation steps. Referring to FIG. 5 again, the cover plate 30 is used to encapsulate the array substrate after the second electrodes are formed.

Figure 8:
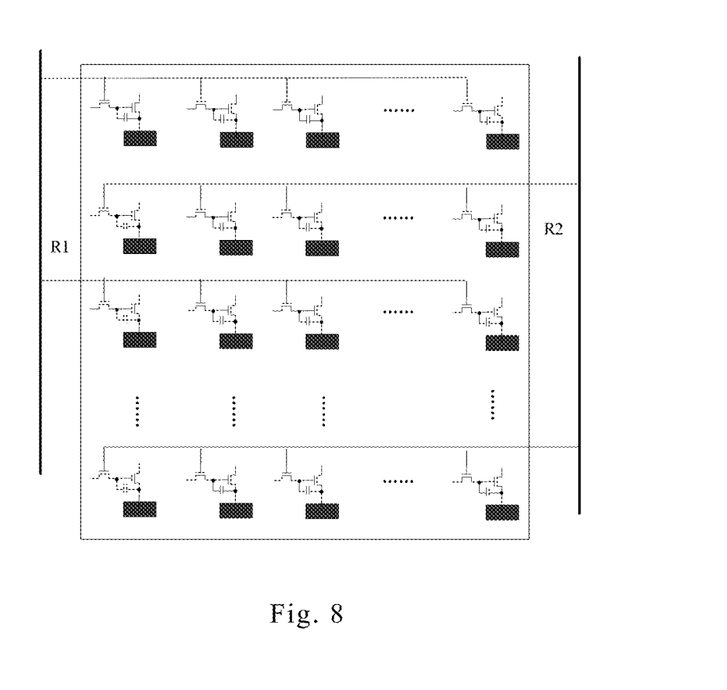
FIG. 8 schematically shows short-circuit rings at the periphery of the array substrate according to an embodiment of the invention.

In yet another embodiment, during the preceding array test process, the scanning lines of the array of pixel switches may be led out using a short-circuit ring to the periphery of the array substrate. For example, as shown in FIG. 8, the scanning lines can be led out in terms of odd rows and even rows to the peripheral short-circuit rings R1, R2, and the scanning lines of odd rows and even rows may be short circuited respectively in the periphery of the display area. In this way, it can be determined whether the array substrate has deficiencies such as short circuit or broken circuit by providing the scanning lines of odd rows and even rows with different electric signals, thereby enhancing the convenience of the test operation.

As stated above, in some embodiments, in step S3, it is possible to only monitor the second currents of the second electrodes within partial regions of the AMOLED array substrate, or selectively monitor the second currents of the second electrodes within certain local regions of the AMOLED array substrate. In such embodiments, if the short-circuit ring is used in previous step, the short-circuit ring may be removed prior to the start of step S3.

The illustrative embodiments of the invention are already described above in detail with reference to the drawings, but such description shall be considered illustrative or exemplary and not restrictive. The present invention is not limited to the disclosed embodiments. The different embodiments described above and in the claims can also be combined. Variations to the disclosed embodiments can be understood and effected by the skilled person in practicing the claimed invention, from a study of the drawings, the disclosure, and the appended claims. These variations also fall within the protection scope of the present invention. Moreover, in the claims, the word such as "comprise" or "include" does not exclude other elements or steps.

The invention claimed is:

1. A method for detecting an array substrate of a display panel, the array substrate being used for driving an electroluminescent device, the array substrate comprising pixel electrodes arranged in an array and an array of pixel switches for driving the pixel electrodes, wherein the method comprises steps of:
    S1, applying a first driving signal to a manufactured array substrate, monitoring a first voltage of the pixel electrodes;
    S2, forming a second electrode on each of the pixel electrodes of the array substrate, each second electrode being in contact with a corresponding pixel electrode;
    S3, applying a second driving signal to the array substrate formed with the second electrode, monitoring a second current flowing through the second electrode,
    wherein each pixel electrode is one of a cathode and an anode of the electroluminescent device, and each second electrode is the other one of the cathode and the anode of the electroluminescent device.

2. The method according to claim 1, wherein manufacturing the array substrate comprises testing the array substrate to determine a deficiency in the array substrate, wherein the method further comprises verifying a test result of the testing by means of the first voltage and the second current.

3. The method according to claim 2, wherein the method further comprises plotting a first voltage contour, the first voltage contour indicating pixel electrodes in the array substrate which have equal first voltages, and plotting a second current contour, the second current contour indicating second electrodes in the array substrate which have equal second currents.

4. The method according to claim 3, wherein the step of verifying a test result of the testing by means of the first voltage and the second current comprises comparing the first voltage contour with the second current contour.

5. The method according to claim 4, wherein the electroluminescent device is an organic light-emitting diode, and the array substrate is an AMOLED array substrate.

6. The method according to claim 3, wherein the electroluminescent device is an organic light-emitting diode, and the array substrate is an AMOLED array substrate.

7. The method according to claim 2, wherein the method further comprises obtaining a first threshold voltage of the pixel switch by means of the first voltage, and obtaining a second threshold voltage of the pixel switch by means of the second current.

8. The method according to claim 7, wherein the method further comprises comparing the first threshold voltage with the second threshold voltage.

9. The method according to claim 8, wherein the electroluminescent device is an organic light-emitting diode, and the array substrate is an AMOLED array substrate.

10. The method according to claim 7, wherein the electroluminescent device is an organic light-emitting diode, and the array substrate is an AMOLED array substrate.

11. The method according to claim 2, wherein after the second electrodes are formed, the array substrate is encapsulated.

12. The method according to claim 11, wherein the step of testing the array substrate to determine a deficiency in the array substrate comprises leading out scanning lines for the array of pixel switches using a short-circuit ring to a periphery of the array substrate.

13. The method according to claim 12, wherein the short-circuit ring is removed prior to the start of the step S3.

14. The method according to claim 13, wherein the electroluminescent device is an organic light-emitting diode, and the array substrate is an AMOLED array substrate.

15. The method according to claim 11, wherein the electroluminescent device is an organic light-emitting diode, and the array substrate is an AMOLED array substrate.

16. The method according to claim 12, wherein the electroluminescent device is an organic light-emitting diode, and the array substrate is an AMOLED array substrate.

17. The method according to claim 2, wherein the electroluminescent device is an organic light-emitting diode, and the array substrate is an AMOLED array substrate.

18. The method according to claim 1, wherein the electroluminescent device is an organic light-emitting diode, and the array substrate is an AMOLED array substrate.

* * * * *